United States Patent [19]

Spence

[11] Patent Number: 5,057,699

[45] Date of Patent: Oct. 15, 1991

[54] SWITCH INTERFACE FOR DETERMINING POSITION OF A PLURALITY OF SWITCHES USING A DETERMINED TIME

[75] Inventor: James W. Spence, Lawrence, Kans.

[73] Assignee: Allied-Signal Inc., Morris Township, Morris County, N.J.

[21] Appl. No.: 453,528

[22] Filed: Dec. 20, 1989

[51] Int. Cl.$^5$ .................. H03M 1/66; G05F 1/00
[52] U.S. Cl. ................................. 307/98; 341/147
[58] Field of Search ............... 307/98, 99, 242, 241, 307/246; 341/147, 151; 333/172, 173; 364/483, 568

[56] References Cited

U.S. PATENT DOCUMENTS

| | | | |
|---|---|---|---|
| Re. 33,119 | 11/1989 | Baker | 62/180 |
| 4,190,824 | 2/1980 | Weber | 341/147 |
| 4,306,223 | 12/1981 | Weber | 341/147 |
| 4,315,413 | 2/1982 | Baker | 62/180 |
| 4,488,823 | 12/1984 | Baker | 374/170 |
| 4,883,991 | 11/1989 | Kröner et al. | 307/246 |

FOREIGN PATENT DOCUMENTS

| | | | |
|---|---|---|---|
| 2627206 | 6/1976 | Fed. Rep. of Germany | 307/246 |
| 4540444 | 7/1967 | Japan | 307/241 |
| 0199321 | 9/1986 | Japan | 307/241 |

Primary Examiner—A. D. Pellinen
Assistant Examiner—Richard Elms
Attorney, Agent, or Firm—C. N. Malvone; H. G. Massung; R. A. Walsh

[57] ABSTRACT

A circuit for interfacing switches to a component which allows the positions of the switches to be determined by the component. The component includes an input port and an output port. A switch network which is a parallel combination of two or more series combinations of a resistor and a switch is connected between the input and output port. A capacitor is connected between the input port and ground. The component determines switch positions by outputting a voltage on the output port and determining the time for the capacitor to charge to a predetermined value. Since each series combination has a unique resistance, the position of the switches therein can be determined in accordance with the capacitor charging time.

15 Claims, 3 Drawing Sheets

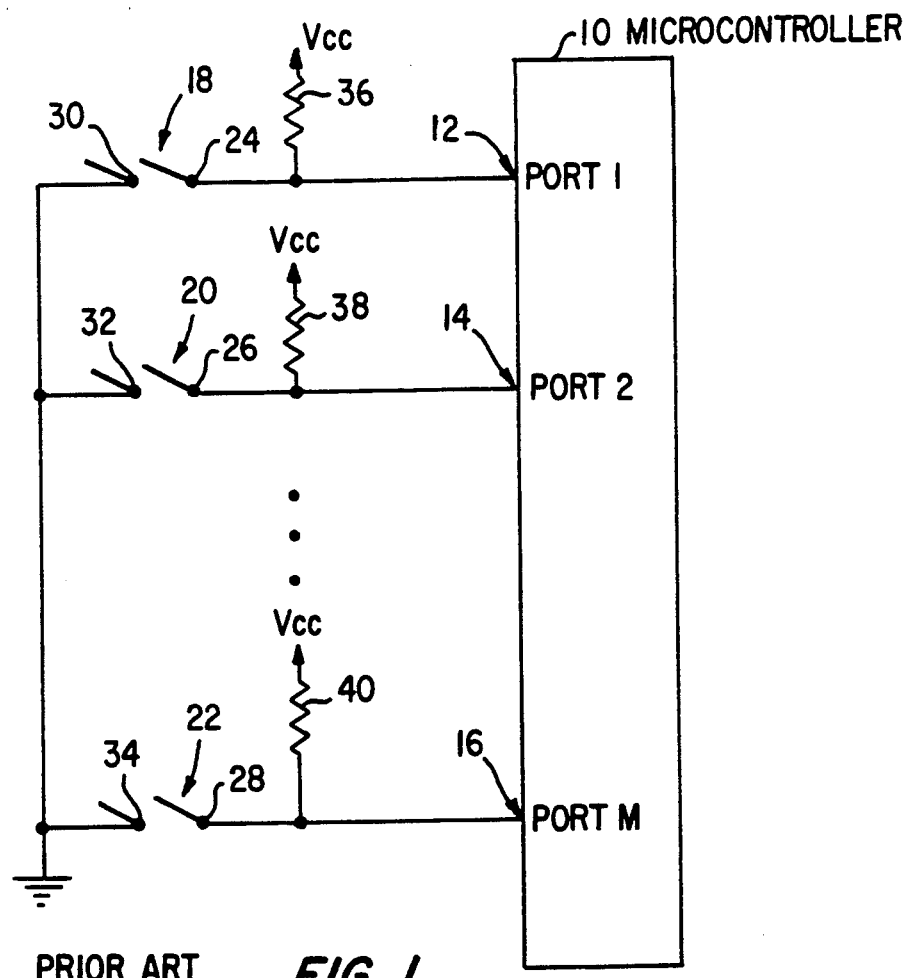
PRIOR ART  FIG. 1
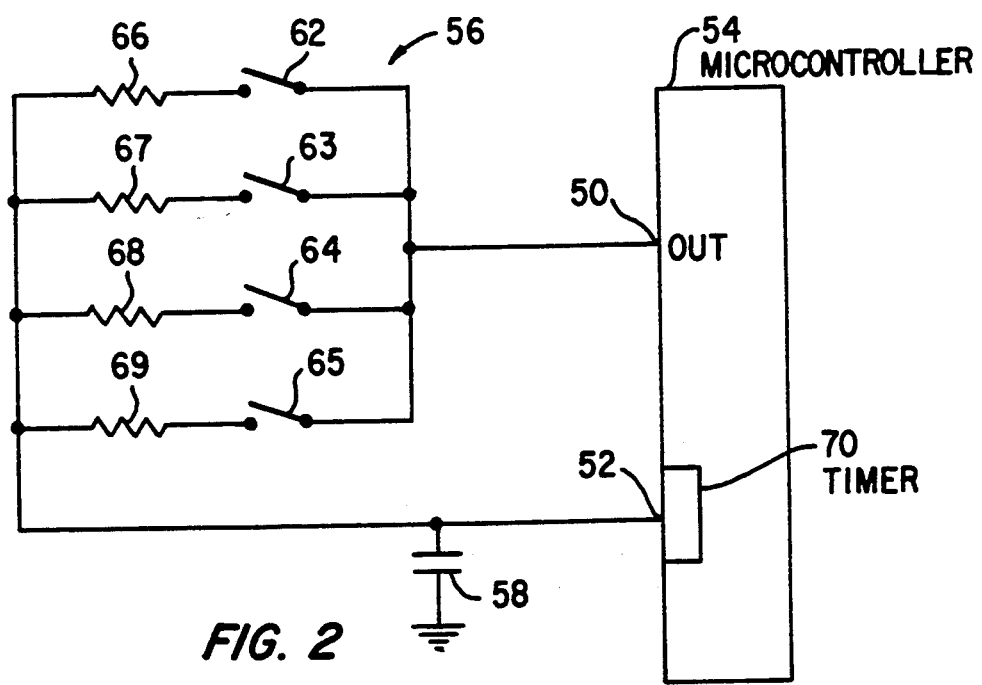
FIG. 2

SWITCH INTERFACE FOR DETERMINING POSITION OF A PLURALITY OF SWITCHES USING A DETERMINED TIME

BACKGROUND OF THE INVENTION

This invention relates to interface circuitry. More specifically, it relates to interface circuitry to determine the state of a plurality of switches.

In many electronic applications, it is desired to interface a large number of switches to devices which have a limited number of input/output ports, for example, a microcontroller. These switches are generally used to indicate the status of a circuit or a system, although the present invention is not limited to such uses. The switches, for example, can be manual switches which are initially set in an open or closed position by a user of a system to indicate a preferred system status. The individual switch settings can be read by a microcontroller which implements the proper initial operating conditions in accordance with the selected positions. As another example, the switches could be latches which are dynamically set to indicate system status.

Conventionally, one switch is interfaced to a microcontroller by using a single input pin and a pull-up resistor, as illustrated in FIG. 1. The conventional switch interface, therefore, limits the number of switches that can be interfaced to a microcontroller.

A problem frequently encountered in the design of microcontroller based circuitry, however, is the limited input/output available in the microcontroller. This is especially true where the full power of the microcontroller is to be utilized. A typical microcontroller, for example, a Motorola 6805, has four eight-bit ports. Some of the input/output pins in these ports, however, can be utilized only for special purpose interfaces, such as serial input/output or timer inputs. In such cases, the number of general purpose ports is limited. Similar problems exist where microcontrollers use their ports to interface to external program memory or where a circuit board having a connector with limited input/output is being interfaced to as well as in many other electronic designs.

A switch interface circuit which allows a decision making component to determine the positions of each individual switch and which minimizes the usage of input/output ports, therefore, is needed.

SUMMARY OF THE INVENTION

The present invention is a switch interface circuit which allows determination of the position of a plurality of switches in the circuit by a component while using only two input/output ports in the component. In a preferred embodiment, the component has a first port which can selectively output at least two voltages, a lower voltage and a higher voltage.

The component also has a second port for input A parallel combination of two or more series combinations of a switch and a resistor is connected between the first and second port. Each of the series combinations in the parallel combination has a unique resistance. A capacitor is connected between the second port and a reference node, such as ground. The component includes means for determining the time for the voltage at the second port to increase to a predetermined level when the first port changes state from the lower voltage to the higher voltage. The component further includes means for determining the position of each of the switches in accordance with the determined time.

DESCRIPTION OF THE DRAWINGS

FIG. 1 illustrates a known switch interface circuit;

FIG. 2 illustrates a switch interface in accordance with the present invention;

DESCRIPTION OF THE PREFERRED EMBODIMENT

Figure 3:
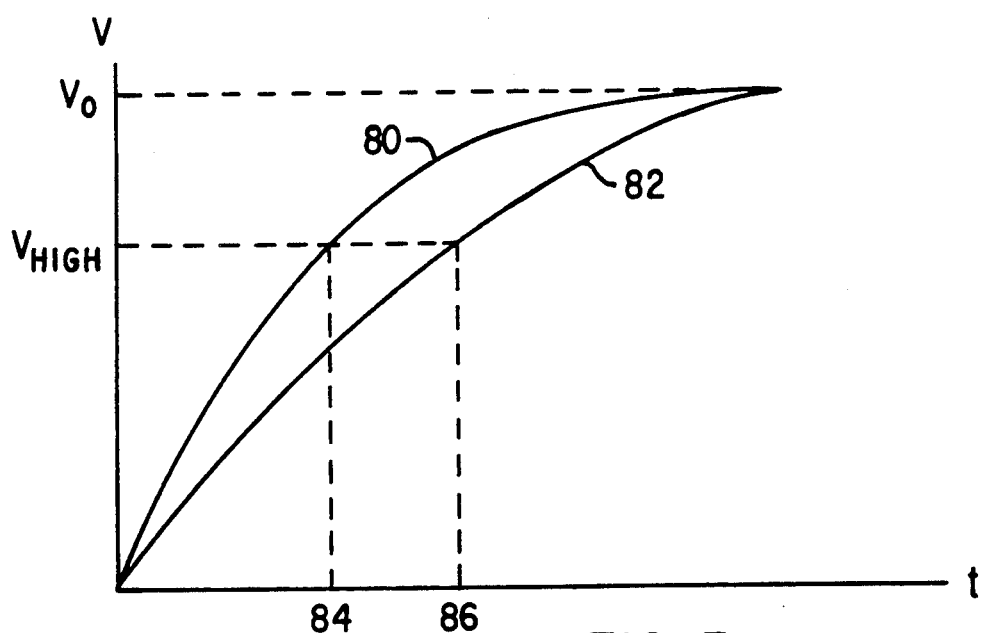
FIGS. 3 through 5 graphically illustrate various methods of determining the positions of the individual switches in the switch interface in accordance with the present invention.

FIG. 1 illustrates a known switch interface circuit. A digital component 10, for example, a microcontroller has M ports, three of which are shown as a first port 12, a second port 14 and a Mth port 16. Each port 12, 14 and 16 is interfaced to a single switch 18, 20 and 22, respectively. These switches 18, 20 and 22 are typically manual switches which are set in a position, either closed or open, by a user of the microcontroller 10 based system to determine a preferred status of the system. The microcontroller 10 determines the positions of the switches 18, 20 and 22 by reading the ports 12, 14 and 16, respectively, to determine the voltages thereon and then controls the status of the system accordingly.

Each of the switches 18, 20 and 22 are single-pull, single-throw (SPST) switches and have a node 24, 26 and 28, respectively, which is connected to the microcontroller 10 at ports 12, 14 and 16, respectively. Each of the switches 18, 20 and 22 further have a second node 30, 32 and 34, respectively, which is connected to ground. Pull-up resistors 36, 38 and 40 are interconnected between the first node 24, 26 and 28, respectively, and a power source VCC.

The operation of the switch interface circuit of FIG. 1 will be explained with reference to the switch 18. When the switch 18 is closed, the ground at the node 30 appears at the node 24 and, therefore, also at the port 12. In this case, the microcontroller 10 would sense a LOW voltage at the first port 12 during its read operation. On the other hand, when the switch 18 is open a voltage V, as determined by the voltage VCC and the resistance of the resistor 36, appears at the port 12. These quantities are selected so that the microcontroller 10 senses a HIGH voltage at the first port 12 during its read operations. The microcontroller 10 can, therefore, determine the position of the switch 18. The interface for the switches 20 and 22 operate in a similar manner.

The switch interface of FIG. 1 requires one port and one pull-up resistor per switch, thereby limiting the number of switches which can be interfaced to the microcontroller 10 by the number of available ports. Furthermore, there is a continuous current flow through each pull-up resistor which increases when the associated switch is in a closed position. The resulting power drain becomes significant as the number of switches and pull up resistors increases and is especially damaging to battery powered devices.

FIG. 2 illustrates a switch interface in accordance with a preferred embodiment of the present invention. The interface uses a single output port 50 and a single input port 52 in a microcontroller 54. A switch network 56, comprising a parallel connection of a plurality of series connections between a switch and a resistor, is connected between the output port 50 and the input port 52. A capacitor 58 is connected between the input port 52 and a node biased at a reference voltage, preferably ground. As before, a user of the microcontroller 54 based system selects the positions of each switch 62 to 65, either open or closed, in accordance with a desired system status. In the case of the switch network 56 of FIG. 2 where there are four switches 62 to 65, there are sixteen possible states in which the combination of the four switches 62 to 65 can be positioned. Sixteen different status conditions, therefore, can be represented.

The microcontroller 54 determines the positions of the switches 62 to 65 as follows. The microcontroller 54 can selectively output at least two voltages, a LOW and a HIGH, at the output port 50. Initially, the capacitor 58 is discharged and the microcontroller 54 outputs a LOW voltage at the output port 50 so that the microcontroller 54 senses a LOW voltage at the input port 52. To determine the switch positions, the microcontroller 54 outputs a HIGH voltage at the output port 50. As a result, a current will flow through the switch network 56 in accordance with the resistance of the resistors 66 to 69 that are connected to the output port 50 by the closure of the associated switches 62 to 65. The capacitor 58 is charged in accordance with the resulting current flow through the network 56. A timer 70 is provided at the input port 52 to measure the time for the capacitor 58 to charge to a predetermined value. In the case of FIG. 2 the predetermined value is the switching threshold of the input port 52.

In order for the microcontroller 54 to be able to uniquely determine the positions of the switches 62 to 65 based on the time for the capacitor 58 to charge to the predetermined value, it is necessary that each series connection in the switch network 56 have a unique resistance associated with it. In the case of FIG. 2, therefore, each resistor 66 to 69 must have a unique resistance. In this way, the time for the capacitor 58 to charge to a predetermined value will be unique for each possible combination of switch positions.

It is preferred to assign unit resistances to the resistors 66 through 69 as follows: to the resistor 66 a unit value of R ohms, to the resistor 67 a unit value of R/2 ohms, to the resistor 68 a unit value of R/4 ohms and to the resistor 69 a unit value of R/8 ohms. If the capacitor 58 has a capacitance of C, then the time constants associated with the charging of the capacitor 58 are as indicated in Table 1. Note that care must be taken to select resistors having resistances and tolerances that insure that none of the time constants of Table 1 overlap. Furthermore, it is preferred to select R and C so as to minimize the charging time of the capacitor 58, thereby minimizing the time for the microprocessors 54 to determine the positions of the switch 62 to 65.

TABLE 1

| Switches Closed | Time Constant (msec) |
| --- | --- |
| None | Infinite |
| 62 | RC |
| 63 | RC/2 |
| 62, 63 | RC/3 |
| 64 | RC/4 |
| 62, 64 | RC/5 |
| 63, 64 | RC/6 |
| 62, 63, 64 | RC/7 |
| 65 | RC/8 |
| 62, 65 | RC/9 |
| 63, 65 | RC/10 |
| 62, 63, 65 | RC/11 |

TABLE 1-continued

| Switches Closed | Time Constant (msec) |
| --- | --- |
| 64, 65 | RC/12 |
| 62, 64, 65 | RC/13 |
| 63, 64, 65 | RC/14 |
| 62, 63, 64, 65 | RC/15 |

The microcontroller 54, therefore, can enable the timer 70 when a HIGH voltage is first output at the port 50, then disable the timer 70 when the capacitor 58 is charged to the predetermined voltage. The microcontroller 54 can then read the output of the timer 70, ie. the time for the capacitor 58 to charge to a predetermined voltage, and refer to a table such as Table 1 which is stored in its memory to determine the position of each of the switches 62 to 65.

One method of determining the time for the capacitor 58 to charge to a predetermined value is illustrated graphically in FIG. 3. Two curves 80 and 82 representing the voltages across the capacitor 58 versus time for two different switch settings are illustrated. By way of example only, the curve 82 might represent the voltage across the capacitor 58 when only the switch 62 is in the closed position so that only the resistor 66 is in the switching network 56 and the time constant of the circuit is RC (see Table 1). In this case, the capacitor 58 charges to $V_{HIGH}$, the switching point of the microcontroller 54, in the time indicated by 86. Curve 80, on the other hand, might represent the voltage across the capacitor 58 when all the switches 62 through 65 are in the closed position, in which case all the resistors 66 through 69 are in the switching network 56, so that the time constant is RC/15. The capacitor 58 then charges to $V_{HIGH}$ in the time indicated by 84. The amount of charging time, therefore, depends on the positions of the switch 62 to 65. The microcontroller 54 determines the switch positions by measuring the capacitor 58 charging time 84 or 86, respectively, and referring to a table such as Table 1.

The method of determining switch positions as illustrated in FIG. 3 is limited when interfacing to digital components to cases where the switching voltage from a LOW voltage to a HIGH voltage is known. For many components, however, the switching point is not accurately specified by the manufacturer. The 6805 microcontroller manufactured by Motorola, for example, has a switching point (LOW to HIGH and HIGH to LOW) with a specified range of 1 V to 3.5 V. The switching point can be measured for each individual component and the method illustrated in FIG. 3 used, however, this is not a viable approach for designs intended for high production quantities.

Figure 4:
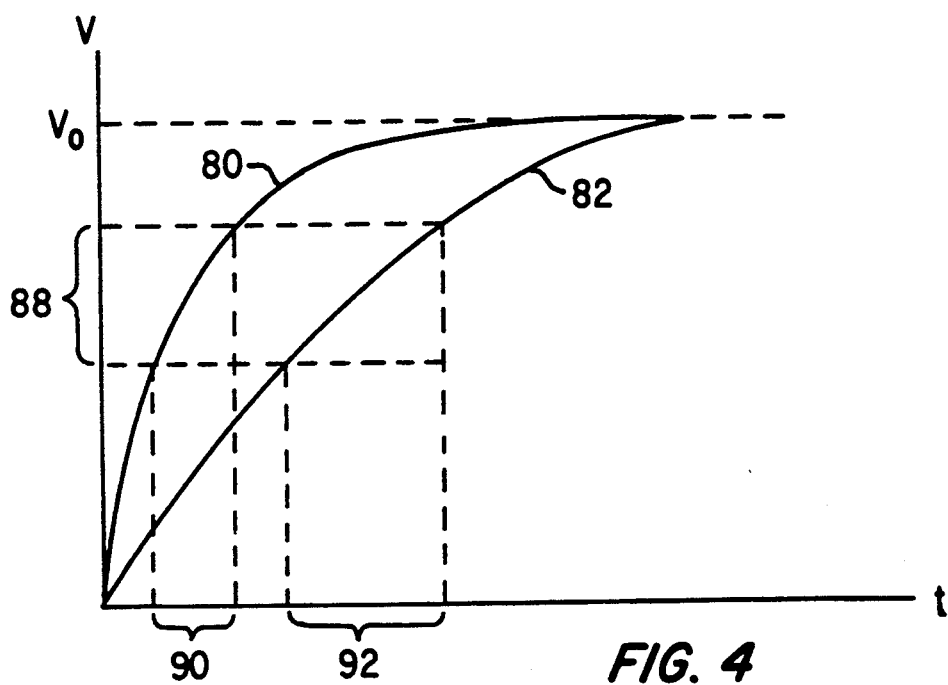

In such cases, an alternative is to select the time constants associated with each combination of switch setting such that the range of possible times for the capacitor 58 to charge to a voltage within a predetermined range (such as the specified range of switching points) is unique for each possible combination of switch settings. Referring to FIG. 4, for example, the switching point for a digital component might fall anywhere in the range indicated by 88. The time constants associated with the curves 80 and 82, however, are selected such that the range of times 90 and 92, respectively, during which the curves have a voltage within the range indicated by 88 are unique. In this way, the microcontroller 54 can uniquely determine the positions of each switch. In this alternative, however, the time available for the microcontroller 54 to wait for the capacitor 58 to charge will limit the number of switches which can be interfaced.

Figure 5:
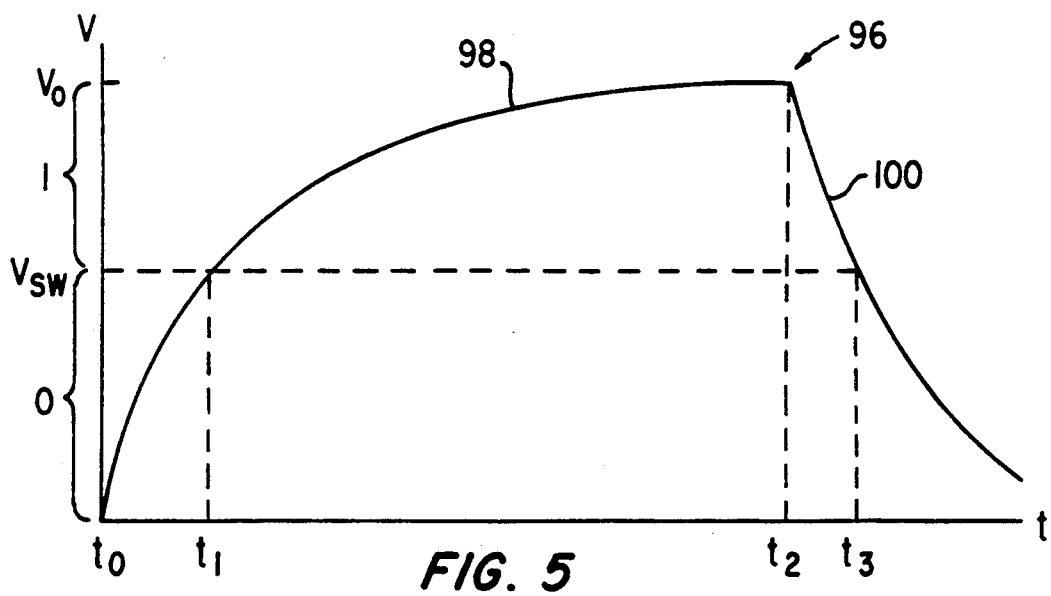

Another method of determining the positions of the switches 62 to 65 is illustrated in FIG. 5. The voltage 96 which exists at the input port 52 of the microcontroller 54 and across the capacitor 58 is illustrated versus time. At time $t_0$, the microcontroller 54 causes the voltage at the output port 50 to change from LOW to HIGH. Depending on the positions of the switches 62 to 65, the capacitor 58 starts to charge in accordance with the portion 98 of the voltage curve 96. The voltage, V(t), across the capacitor 58 at a time t, is in accordance with the following equation:

$$V(t) = V_o(1 - e^{-t/\tau})$$

where $V_o$ is the voltage at the output port 50 and $\tau$ is the time constant of the switch network 56 which depends on the settings of the switches 62 to 65. The microcontroller 54 monitors V(t) by enabling the timer 70 upon outputting a HIGH at the port 50. The timer 70, once enabled, counts until time $t_1$, when V(t) reaches the switching point voltage of the microcontroller 54 at $V_{sw}$. The microcontroller 54 can then read the timer 70 to determine the count as well as the time $t_1$. Alternatively, if the timer 70 was not available, the microcontroller could continuously read the value at the port 52 in a software loop and determine the time $t_1$ by the number of loops.

The microcontroller 54 then waits a predetermined amount of time, for example, to time $t_2$ to allow the capacitor 58 to fully charge to the voltage level, $V_o$. At time $t_2$, the microcontroller 54 changes the voltage at the output port 50 from HIGH to LOW, allowing the capacitor 58 to discharge along the portion 100 of the voltage curve 96. The voltage V(t) across the capacitor 58 is in accordance with the following equation:

$$V(t) = V_o e^{-(t-t_2)/\tau}$$

where $V_o$ and $\tau$ are as before. When V(t) equals $V_{sw}$ at time $t_3$ the microcontroller 54 reads a LOW at the input port 52. In this case, the timer 70 is enabled and starts counting at time $t_2$ and is disabled and stops counting at time $t_3$, thereby determining the discharge time $t_3 - t_2$. Again, a software loop can be used to determine this time.

By performing these two operations, the microcontroller 54 has determined the following two equations:

$$V_{sw} = V_o(1 - e^{-t_1/\tau}) \quad (1)$$

$$V_{sw} = V_o e^{-(t_3 - t_2)/\tau} \quad (2)$$

By setting $$V_o(1 - e^{-t_1/\tau}) = V_o e^{-(t_3 - t_2)/\tau}$$

and substituting the time $t_1$ as measured by the timer 70 during the first operation and then substituting the time $t_3 - t_2$ as determined by the timer 70 during the second operation, a solvable expression for $\tau$, the RC time constant of the switch network 56 is obtained. The expression can be solved graphically or by means of a look up table of associated values, such as shown in Table 1. It can also be solved by means of linear approximation.

The following liner approximation for $\tau$ is particularly well suited to microprocessor based solution and is derived by using equations (1) and (2) and an error criterion to be described shortly:

$$\tau' = (k_1 \times t_b) + (k_2 \times t_s) \quad (3)$$

where $t_b$ and $t_s$ are the larger and smaller of $t_{on}$ or $t_{off}$, respectively. $t_{on}$ equals $t_1$ and $t_{off}$ equals $t_3 - t_2$. The constants $k_1$ and $k_2$ are chosen to minimize the error between $\tau$ and $\tau'$. The following method is used to derive these constants.

Equations (1) and (2) lead to equations (1a) and (2a):

$$\tau/t_{off} = (1/-\ln(1 - \exp(-1/(\tau/t_{off})))) \times (1/t_{off}/t_{on})) \quad (1a)$$

$$\tau/t_{on} = (1/-\ln(1 - \exp(1/(-\tau/t_{on})))) \times (t_{off}/t_{on}) \quad (2a)$$

where $t_{on}$ equals $t_1$ and $t_{off}$ equals $t_3 - t_2$. These may be rewritten as:

$$\tau/t_{off} = f_1(t_{off}/t_{on}) \quad (1b)$$

$$\tau/t_{on} = f_2(t_{off}/t_{on}) \quad (2b)$$

It may be seen from equations (1a) and (2a) that $f1(\lambda = f2(1/\lambda)$. Using this fact, the following results:

$$\tau = t_s \times f_2(t_b/t_s) \quad (4)$$

Approximating $f_2$ as:

$$f_2 = k_1(t_b/t_s) + k_2$$

equation 3 is seen to be a combination of equations (4) and (5) Now an error, e, between $\tau$ and $\tau'$ is defined as:

$$e = (\tau' - \tau)/\tau \quad (6)$$

It may be shown that:

$$e = (k_1 \times \ln(V_0/V_{sw})) + (k_2 \times \ln(V_0/(V_0 - V_{sw})) - 1) \quad (7)$$

The error e will be at a maximum at one of three values of Vsw:

$$V_{sw} = V_{min}$$

$$V_{sw} = V_{max}$$

$$V_{sw} = (k_1/(k_1 + k_2)) \times V_0$$

The constants $k_1$ and $k_2$ are chosen to minimize equation 7 with these three values of $V_{sw}$.

The error equation (7) was written for the case of $t_{on} \geq t_{off}$. A similar equation may be written for the case $t_{on} \leq t_{off}$. If this similar equation yields larger values for the error, e, it would be used to determine $k_1$ and $k_2$ instead f using equation (7).

It is preferred to use a microcontroller 54 having an internal timer 70 which can determine the time for the capacitor 58 to charge to a predetermined level. The Motorola 6805, for example, has an internal timer having a dedicated input port. If, however, the device having limited input/output to which a plurality of switches is interfaced does not have an internal timer 70, then an external timer, such as an MC6840, or an internal software routine, as mentioned before, could be implemented to determine the time for the capacitor 58 to change to the predetermined level.

Any number, N, of series connections of a resistor and a switch can be included in the parallel combination thereof, as long as time constants are appropriately selected so that the device 70 measuring the time for the capacitor 58 to charge (or discharge as in FIG. 5) to a predetermined level has enough resolution to distinguish between unique time constants. For example, if the internal Motorola 6805 timer port is utilized, then the maximum distinguishable time interval is 2 μs., In this case, N and the values of the resistors and the capacitor must be selected such that the time constants for each possible combination of switch positions are spaced apart by more than 2 μs.

Figure 6:
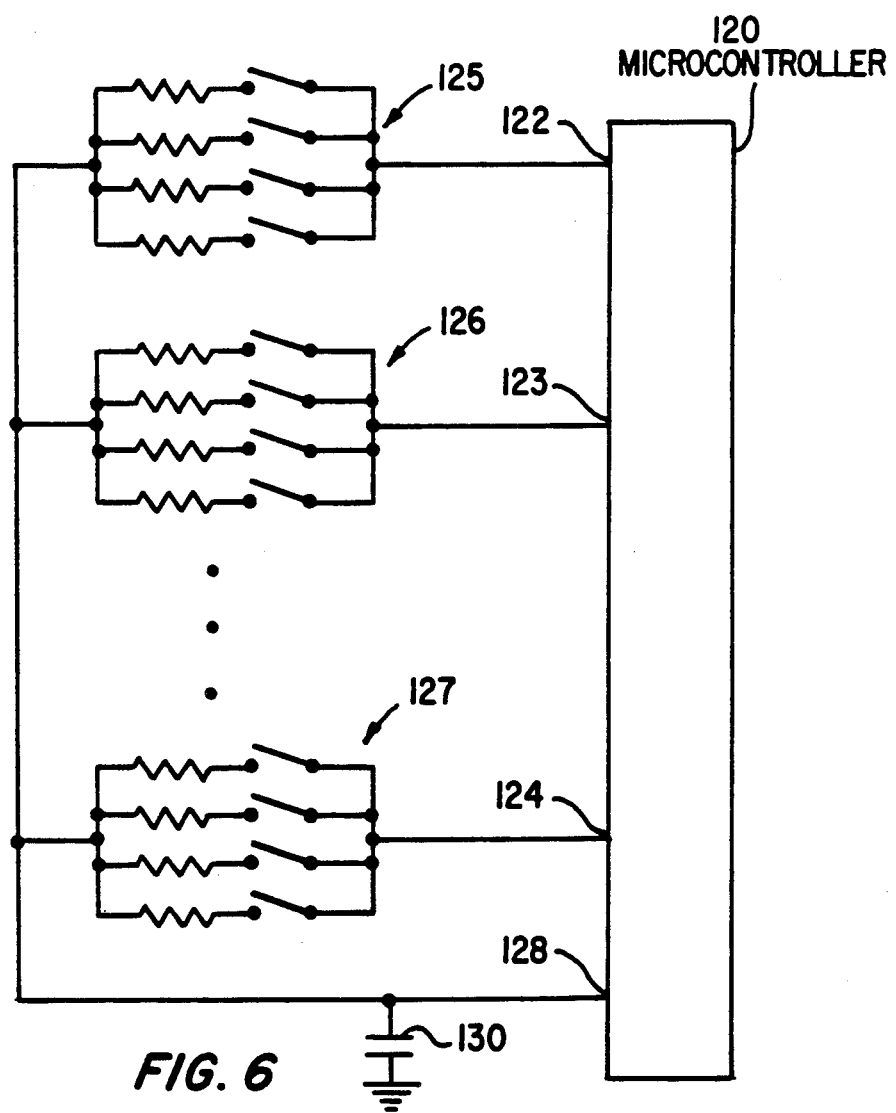
FIG. 6 illustrates the use of a plurality of the switch interface networks of FIG. 2.

In cases where the maximum number of series connections is reached for a single port, the arrangement illustrated in FIG. 6 can be used. A microcontroller 120 has a plurality of output ports 122 to 124. Each output port 122 to 124 is interfaced to a switching network 125 to 127, respectively. Each switching network 125 to 127 consists of a parallel combination of a plurality of series connections of a resistor and a switch, as before. Each switching network 125 through 127 is further connected through a common point to an input port 128. A capacitor 130 is connected between a reference voltage, preferably ground and the input port 128. When the microcontroller 120 wants to determine the status of one of the switching networks 125 to 127, one of the methods as illustrated in FIGS. 3 through 5 is used with relation to the associated output port 122 to 124, respectively.

Although a preferred embodiment of the present invention has been illustrated, alternate embodiments are possible. For example, the component to which the switch circuit is interfaced can be any component which needs to determine switch settings. By way of example only it could be a circuit board, as very often the input/output pins between boards is limited. Also, the switches in the interface circuit are not necessary SPST manual switches they can be any type of switch, such as digital latching devices.

I claim:

1. A switch interface, comprising:
   a first port for selectively outputting a lower and a higher voltage;
   a second port;
   a plurality of series combinations of a switch and a resistor which are connected in a parallel circuit, each of said plurality of series combinations having a unique resistance and each of said switches being in an open or closed position, said parallel circuit having a first node connected to said first port and a second node connected to said second port;
   a capacitor connected between said second port and a node biased at a reference voltage;
   means for determining a time for a voltage at said second port to increase to a predetermined voltage level when said first port changes state from said lower voltage to said higher voltage; and
   means for determining said position of each of said switches in accordance with said time.

2. The switch interface as claimed in claim 1, further comprising:
   a plurality of ports for selectively outputting a lower and a higher voltage;
   for each of said plurality of ports for selectively outputting a lower and a higher voltage, a plurality of series combinations of a switch and a resistor which are connected in parallel, each of said plurality of series combinations having a unique resistance and each of said switches being in an open or closed position, said parallel circuit having a first node connected to said port for selectively outputting one of two voltages and a second node connected to said second port.

3. The switch interface as claimed in claim 1, wherein said reference voltage node is grounded.

4. The switch interface as claimed in claim 1, wherein a Nth series combination in said plurality of series combinations has a resistance equal to $R/2^{(N-1)}$.

5. The switch interface as claimed in claim 1, wherein said plurality of switches are interfaced to a digital component wherein said first port initially outputs a LOW voltage and said second port is initially biased at said reference voltage, said component outputting a HIGH voltage at said first port when said position of each of said plurality of switches is to be determined.

6. The switch interface as claimed in claim 5, wherein said digital component is a microcontroller.

7. The switch interface as claimed in claim 5, wherein said digital component includes an internal timer to determine said time.

8. The switch interface as claimed in claim 5, wherein said predetermined voltage level is the switching threshold of said digital component.

9. The switch interface as claimed in claim 8, wherein said switching threshold is specified to be within a voltage range and said resistance of each of said plurality of series combinations is selected such that said voltage at said second port reaches said predetermined voltage at a unique range of times for each possible combination of switch positions.

10. The switch interface as claimed in claim 5, wherein the potential of said first port is changed from said lower voltage to said higher voltage said means for determining a time determines the time, $t_1$, for said voltage at said second port to switch from a LOW to a HIGH voltage and then the potential of said first port is changed from said higher voltage to said lower voltage and said means for determining a time determines the time for said voltage at said second port to switch from a HIGH to a LOW voltage.

11. A method of interfacing a plurality of switches to a component such that the component can determine the positions of each individual switch, the component having an input and an output port initially biased at a LOW voltage, the switch interface having a parallel combination of a plurality of series combinations of a switch and a resistor, the parallel combination being connected between the input and output port, each series combination having a unique resistance, and a capacitor connected between the input port and a node biased at a reference voltage, comprising the steps of:
   outputting a HIGH voltage on the output port;
   determining the time for the capacitor to charge to a predetermined voltage; and
   determining the positions of the switches in accordance with the time.

12. The method as claimed in claim 11, wherein said predetermined voltage is the switching threshold of a digital component.

13. A method of interfacing a plurality of switches to a component such that the component can determine the position of each individual switch, the component having an input and an output port initially biased at a LOW voltage. The switch interface having a parallel combination, of a plurality of series combinations of a switch and a resistor, the parallel combination being connected between the input and output port, each series combination having a unique resistance, and a capacitor connected between the input port and a node biased at a reference voltage, comprising the steps of:
outputting a HIGH voltage on the output port;
determining the time for the capacitor to charge to a predetermined level;
outputting a LOW voltage on the output port;
determining the time for the capacitor to discharge to a predetermined level; and
determining the positions of the switches in accordance with the charging and discharging times.

14. The method as claimed in claim 13, wherein the capacitor is allowed to fully charge between outputting the HIGH and LOW voltages.

15. The method as claimed in claim 13, wherein said predetermined level is the switching point of a digital component.

* * * * *